(12) United States Patent
Lai

(10) Patent No.: US 9,601,506 B2
(45) Date of Patent: Mar. 21, 2017

(54) SEMICONDUCTOR STRUCTURE AND METHOD FOR MANUFACTURING THE SAME

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 89 days.

(21) Appl. No.: 14/620,281

(22) Filed: Feb. 12, 2015

(65) Prior Publication Data

US 2016/0240551 A1    Aug. 18, 2016

(51) Int. Cl.
*H01L 27/11* (2006.01)
*H01L 27/115* (2006.01)

(52) U.S. Cl.
CPC .... *H01L 27/11582* (2013.01); *H01L 27/1157* (2013.01)

(58) Field of Classification Search
CPC .. G11C 2213/75; G11C 16/0483; G11C 16/04
See application file for complete search history.

(56) References Cited

U.S. PATENT DOCUMENTS

| | | | |
|---|---|---|---|
| 2012/0081958 A1* | 4/2012 | Lee | G11C 16/0483 365/185.05 |
| 2012/0181596 A1* | 7/2012 | Liu | H01L 27/11565 257/316 |
| 2015/0108563 A1* | 4/2015 | Lai | H01L 27/11578 257/324 |

* cited by examiner

*Primary Examiner* — Armando Rodriguez
(74) *Attorney, Agent, or Firm* — McClure, Qualey & Rodack, LLP

(57) ABSTRACT

A semiconductor structure is provided. The semiconductor structure comprises a substrate, stacks, a blocking layer-trapping layer-tunneling layer structure, channel layers, a first insulating material and a dielectric layer. The stacks are formed on the substrate. Each stack comprises a group of alternating conductive strips and insulating strips as well as a first string select line formed on the group. The blocking layer-trapping layer-tunneling layer structure and the channel layers are formed conformally with the stacks. The first insulating material is formed between the stacks and covers portions of the channel layers. The dielectric layer is formed on portions of the channel layers that are not covered by the first insulating material. The semiconductor structure further comprises second string select lines formed between the stacks on the first insulating material, wherein the second string select lines are separated from the channel layers by the dielectric layer.

18 Claims, 17 Drawing Sheets

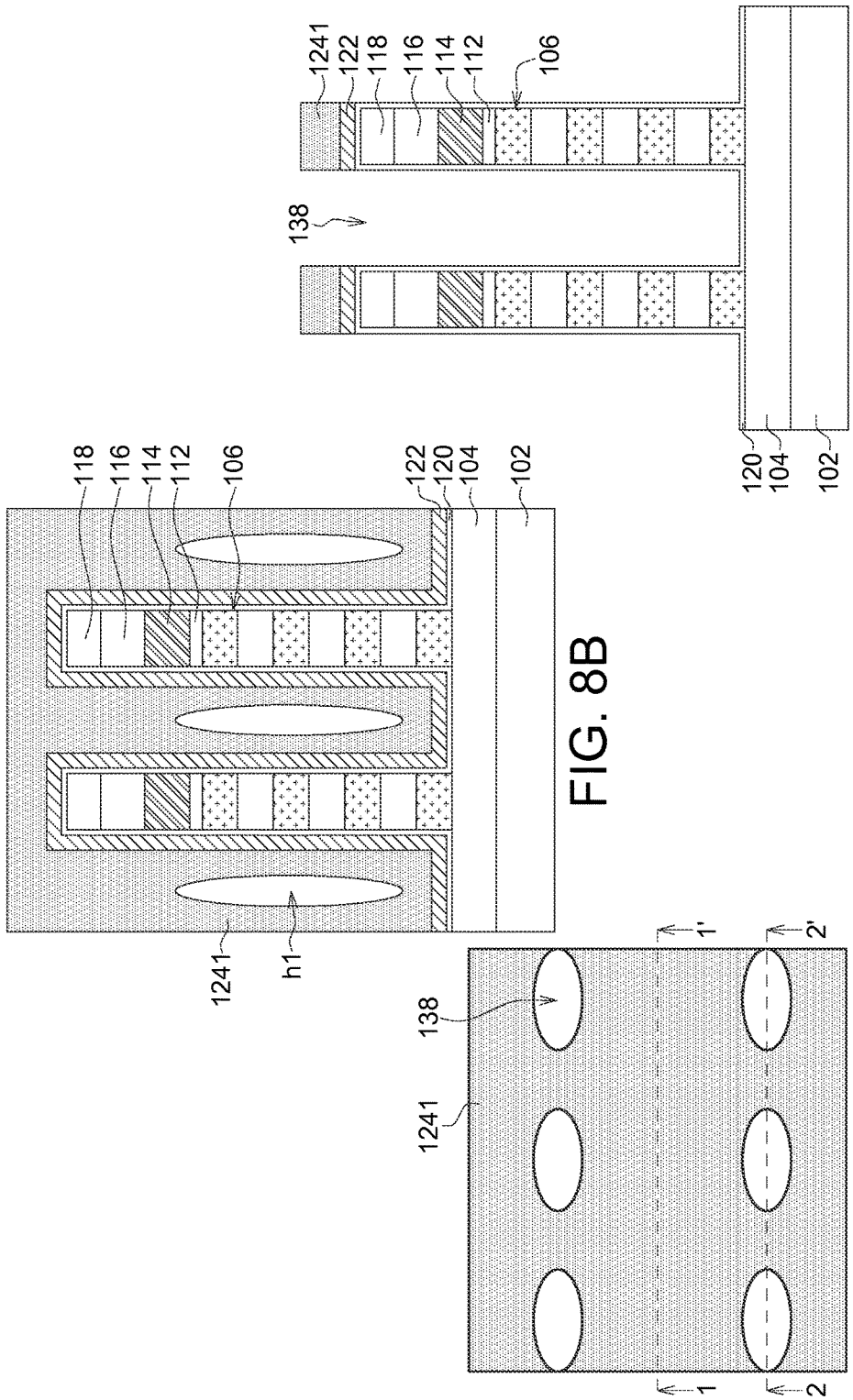

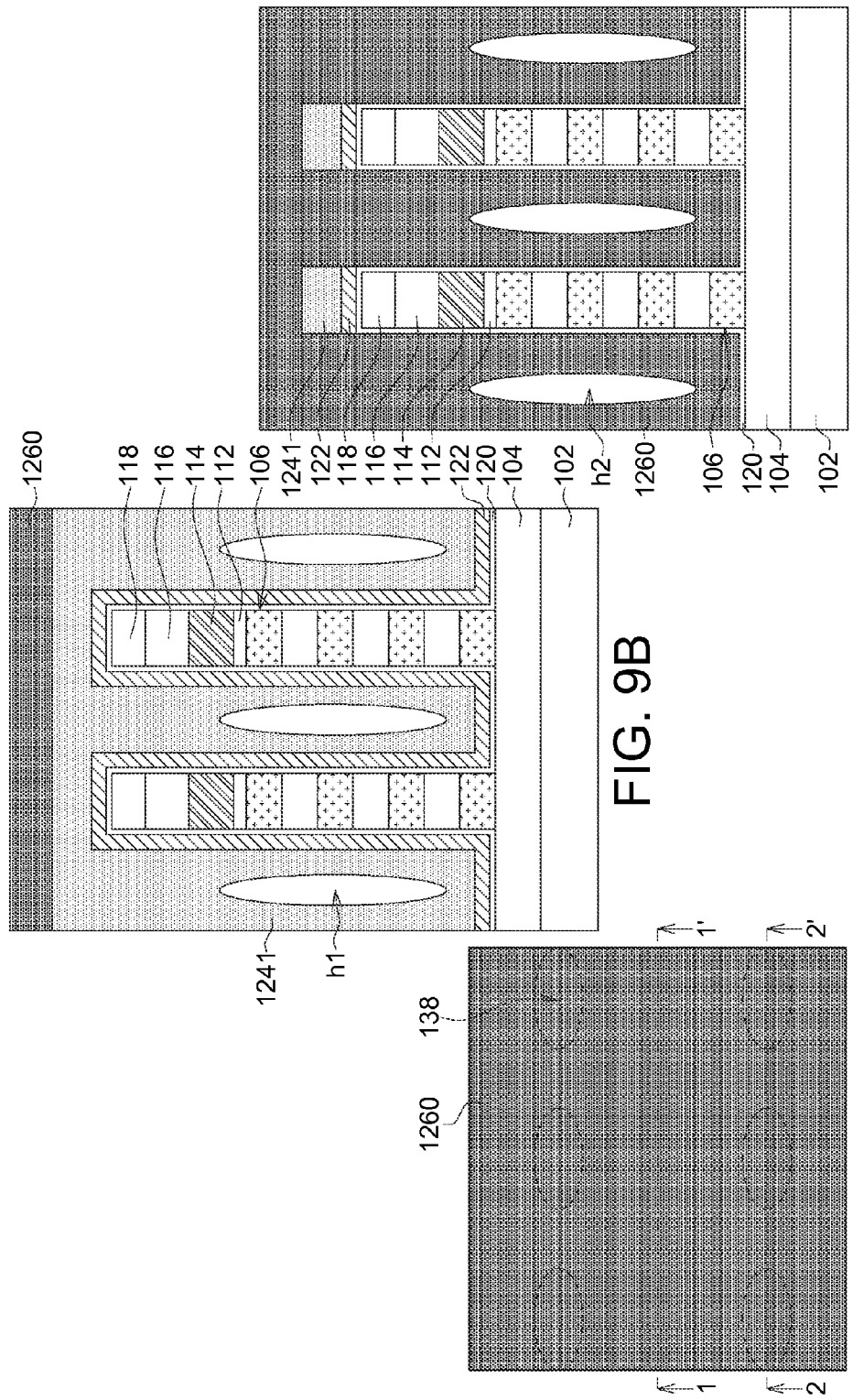

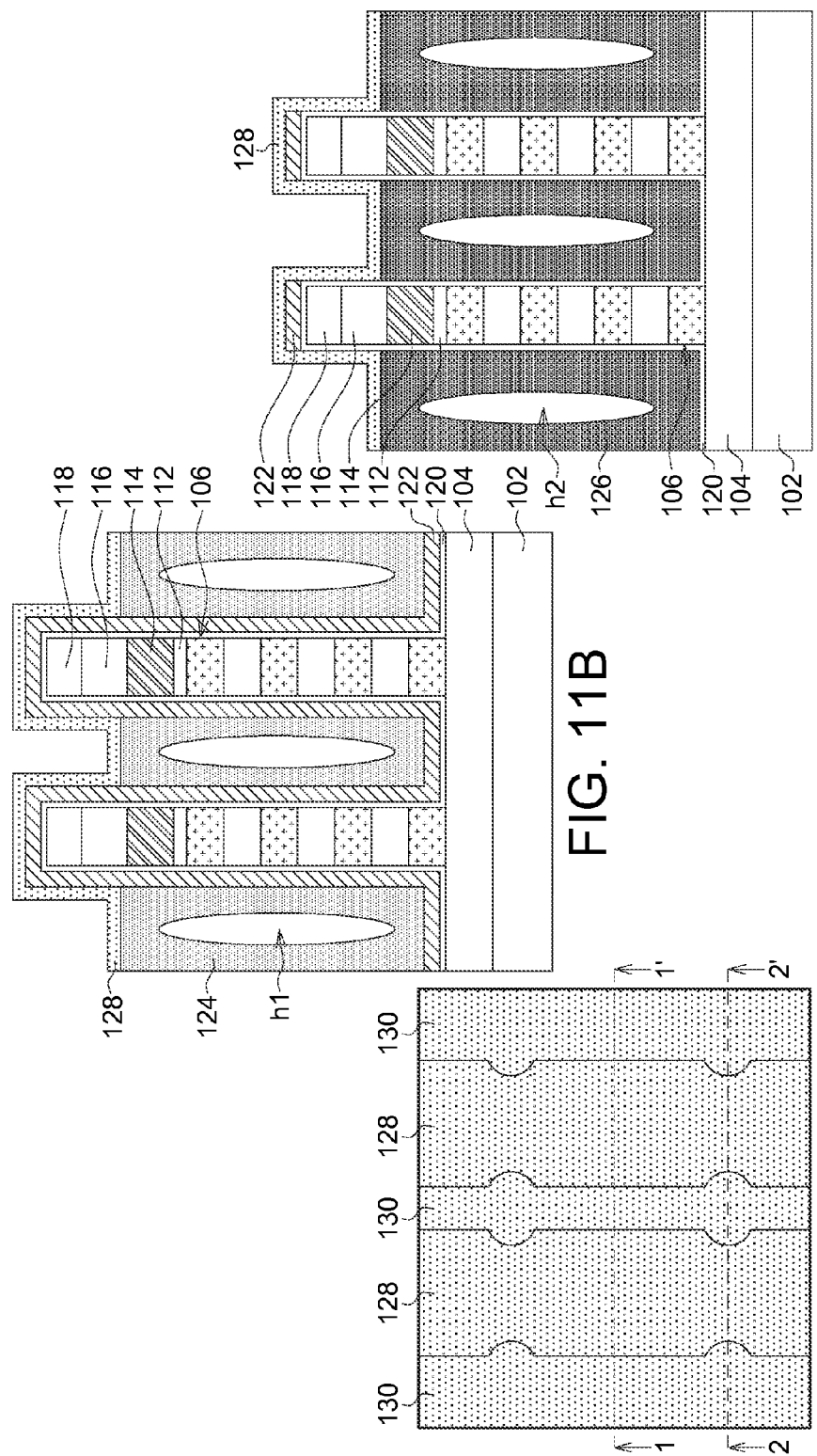

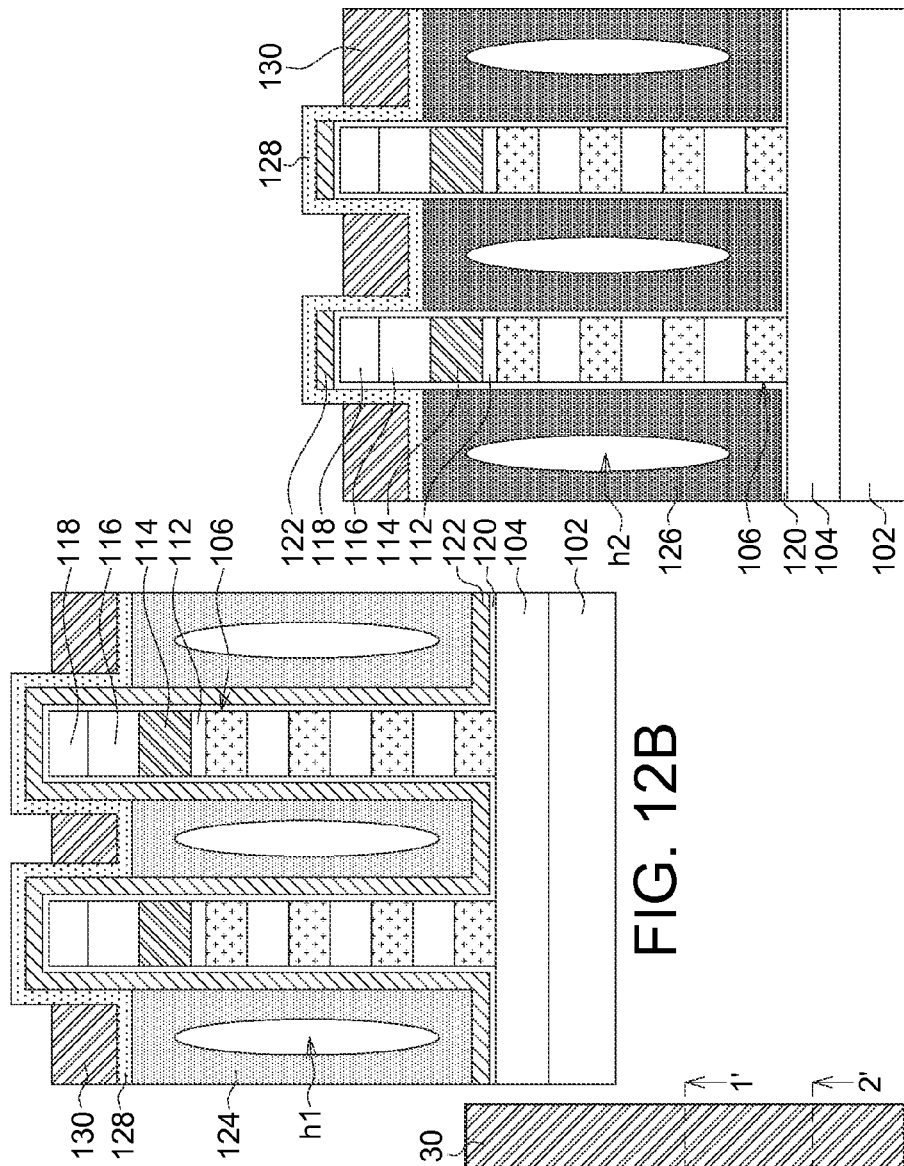
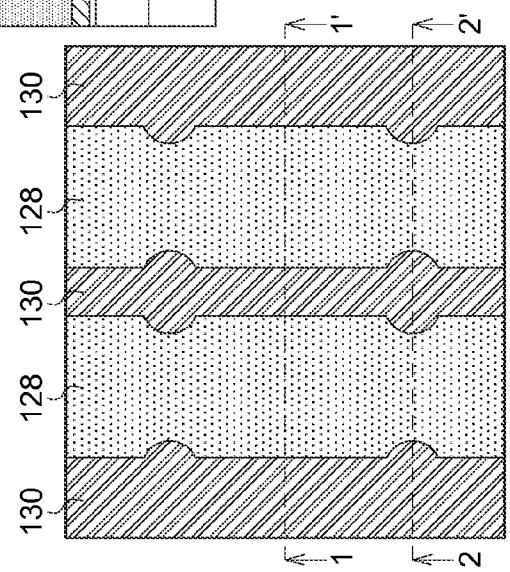
FIG. 12A
FIG. 12B
FIG. 12C

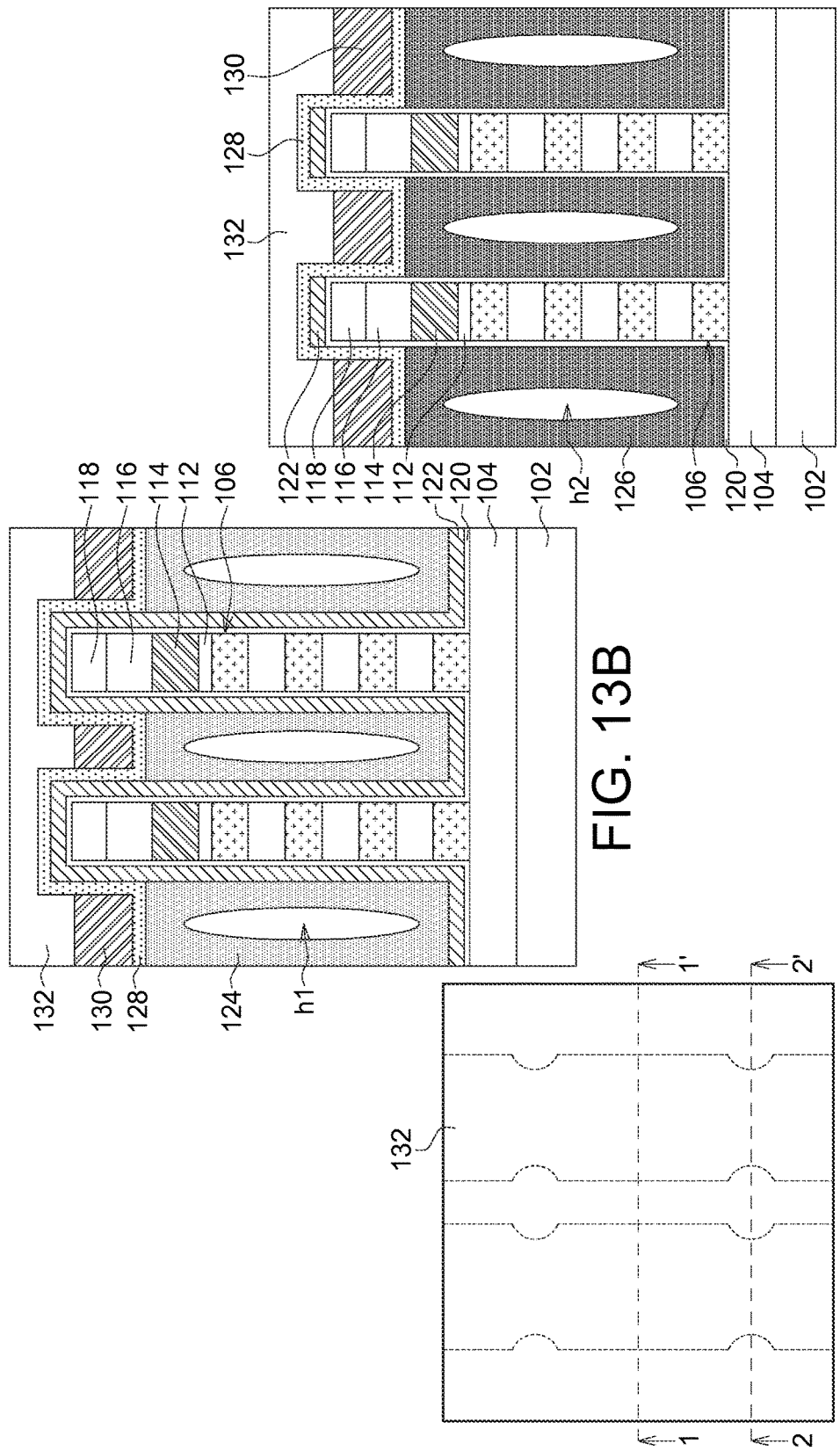

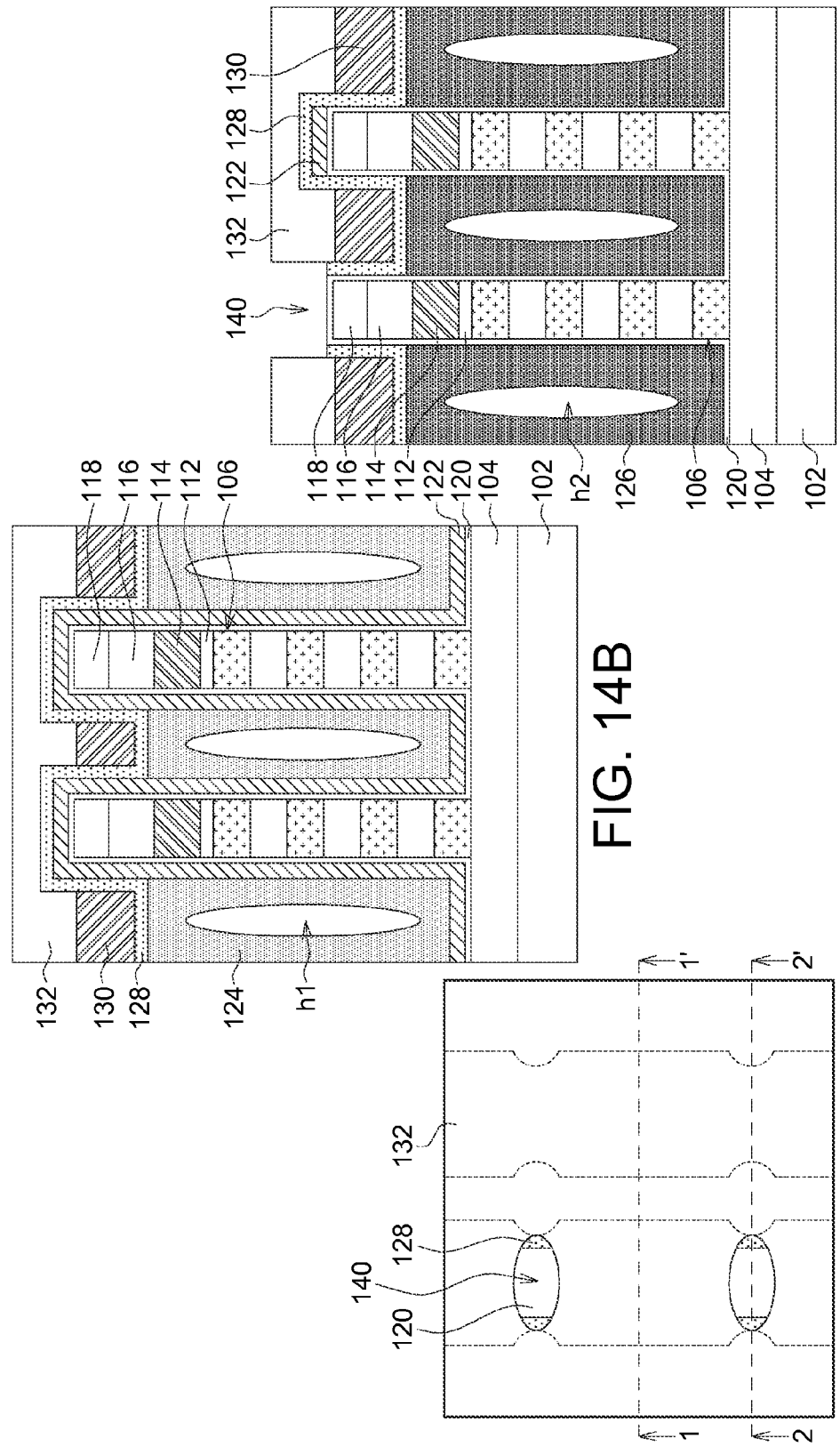

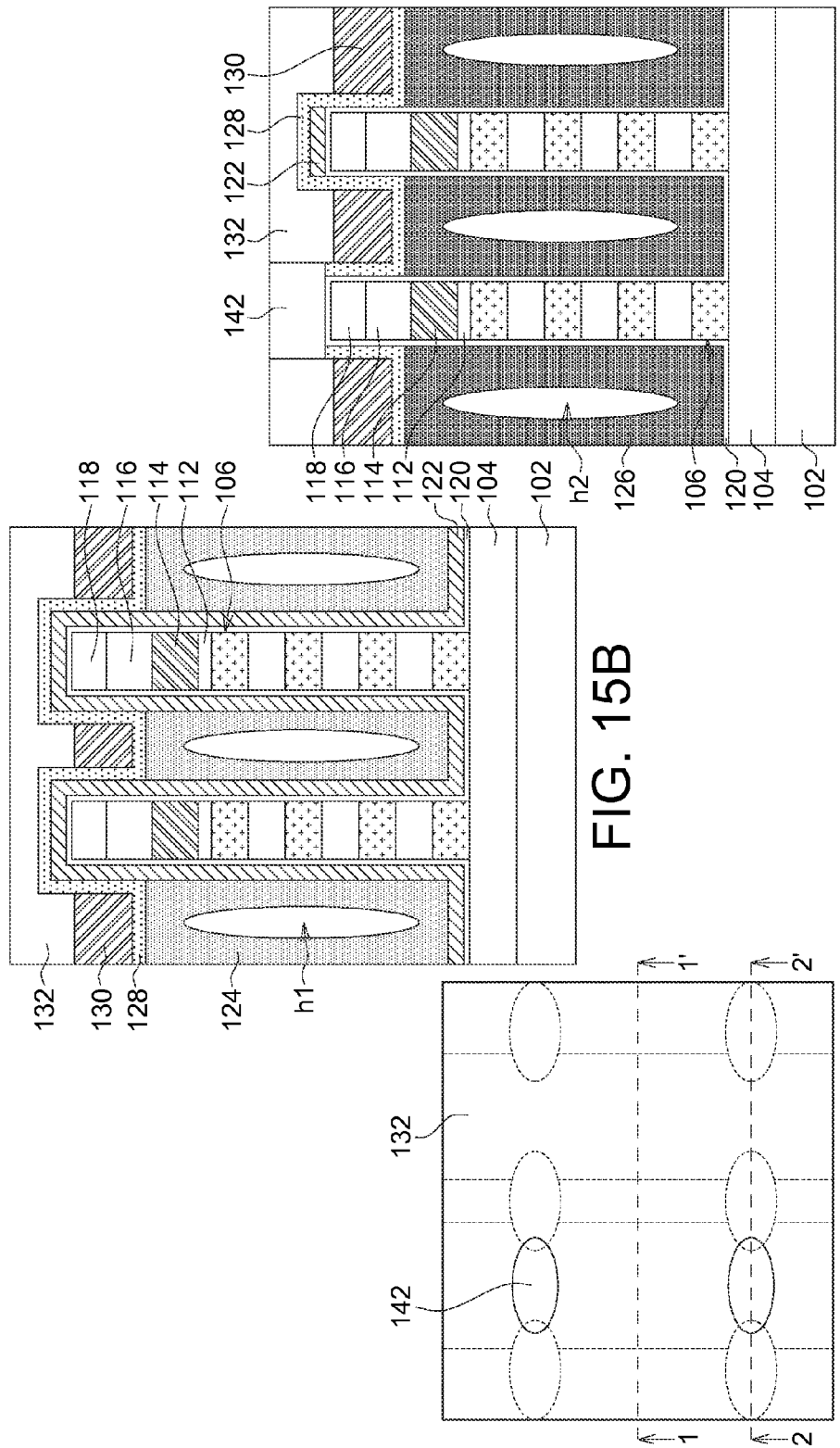

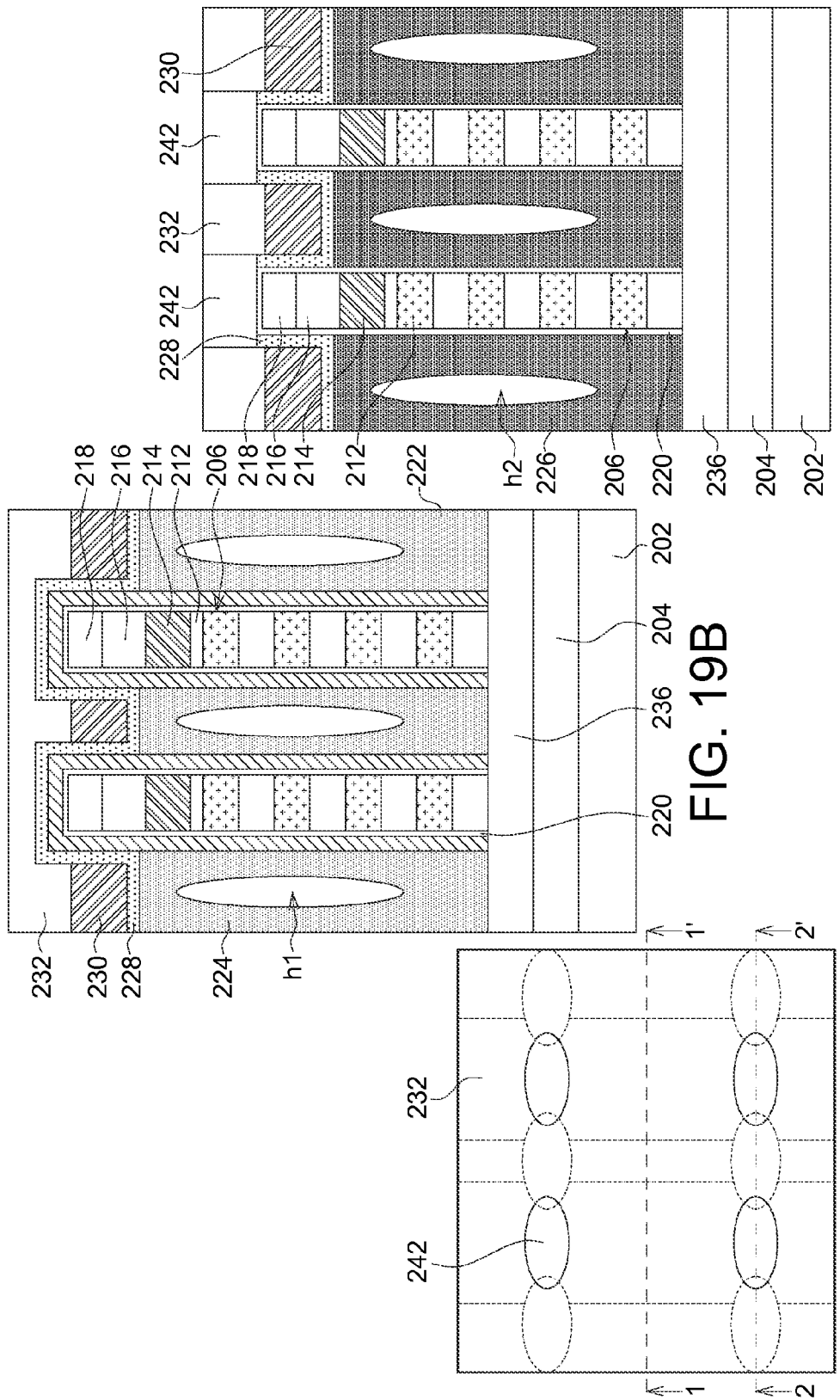

SEMICONDUCTOR STRUCTURE AND METHOD FOR MANUFACTURING THE SAME

TECHNICAL FIELD

This disclosure relates to a semiconductor structure and a method for manufacturing the same. More particularly, this disclosure relates to a semiconductor structure comprising two sets of string select lines and a method for manufacturing the same.

BACKGROUND

For reasons of decreasing volume and weight, increasing power density, improving portability, and the like, researcher and engineers have made every effort to increasing the density of semiconductor devices. One way to achieve this is using a 3-D structure instead of a conventional 2-D structure. Another way is decreasing sizes of every elements of the device. Both way have their own technological bottlenecks to be resolved.

SUMMARY

This disclosure is directed to a structure and a method by which physical two-bits structure can be achieved.

According to one embodiment, a semiconductor structure is provided. The semiconductor structure comprises a substrate, a plurality of stacks, a blocking layer-trapping layer-tunneling layer structure, a plurality of channel layers, a first insulating material and a dielectric layer. The stacks are formed on the substrate. Each of the stacks comprises a group of alternating conductive strips and insulating strips as well as a first string select line formed on the group of the conductive strips and the insulating strips. The blocking layer-trapping layer-tunneling layer structure is formed on the stacks. The blocking layer-trapping layer-tunneling layer structure is formed conformally with the stacks. The channel layers are formed on the blocking layer-trapping layer-tunneling layer structure. The channel layers are formed conformally with the stacks. The first insulating material is formed between the stacks. The first insulating material covers portions of the channel layers. The dielectric layer is formed on portions of the channel layers that are not covered by the first insulating material. The semiconductor structure further comprises a plurality of second string select lines. The second string select lines are formed between the stacks on the first insulating material. The second string select lines are separated from the channel layers by the dielectric layer.

According to one embodiment, a method for manufacturing a semiconductor structure is provided. The method comprises the following steps. A substrate is provided. A plurality of stacks are formed on the substrate. Each of the stacks comprises a group of alternating conductive strips and insulating strips as well as a first string select line formed on the group of the conductive strips and the insulating strips. A blocking layer-trapping layer-tunneling layer structure is formed on the stacks. The blocking layer-trapping layer-tunneling layer structure is formed conformally with the stacks. A plurality of channel layers are formed on the blocking layer-trapping layer-tunneling layer structure. The channel layers are formed conformally with the stacks. A first insulating material is formed between the stacks. The first insulating material covers portions of the channel layers. A dielectric layer is formed on portions of the channel layers that are not covered by the first insulating material. A plurality of second string select lines are formed between the stacks on the first insulating material. The second string select lines are separated from the channel layers by the dielectric layer.

BRIEF DESCRIPTION OF THE DRAWINGS

FIG. 3-FIG. 15C illustrate steps of a method for manufacturing a semiconductor structure according to one embodiment.

FIG. 18A-FIG. 18B and FIG. 19A-FIG. 19C illustrate steps of a method for manufacturing a semiconductor structure according to another embodiment.

Figure 2:
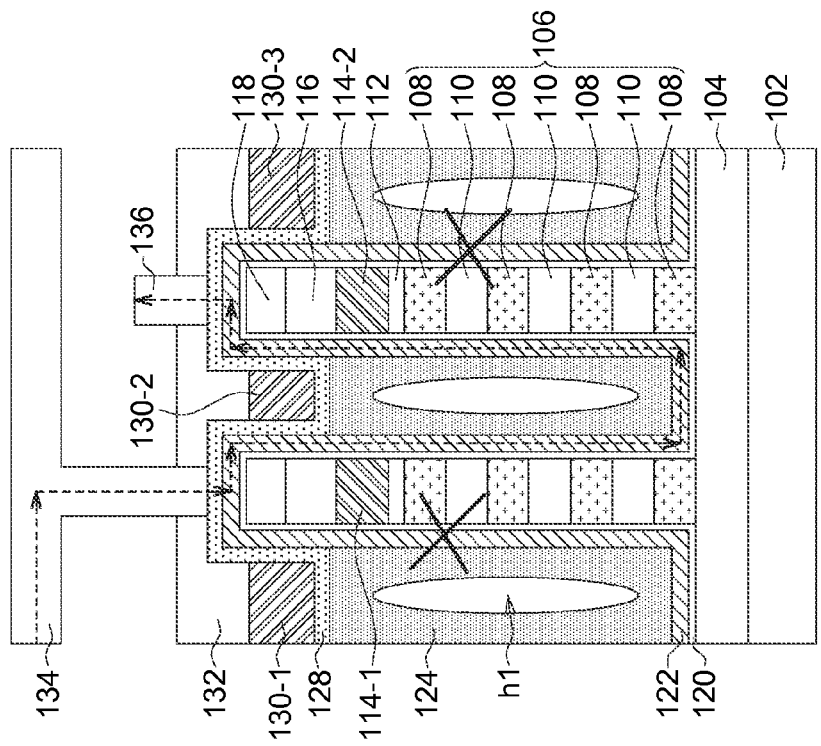
FIG. 1 and FIG. 2 illustrate a semiconductor structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
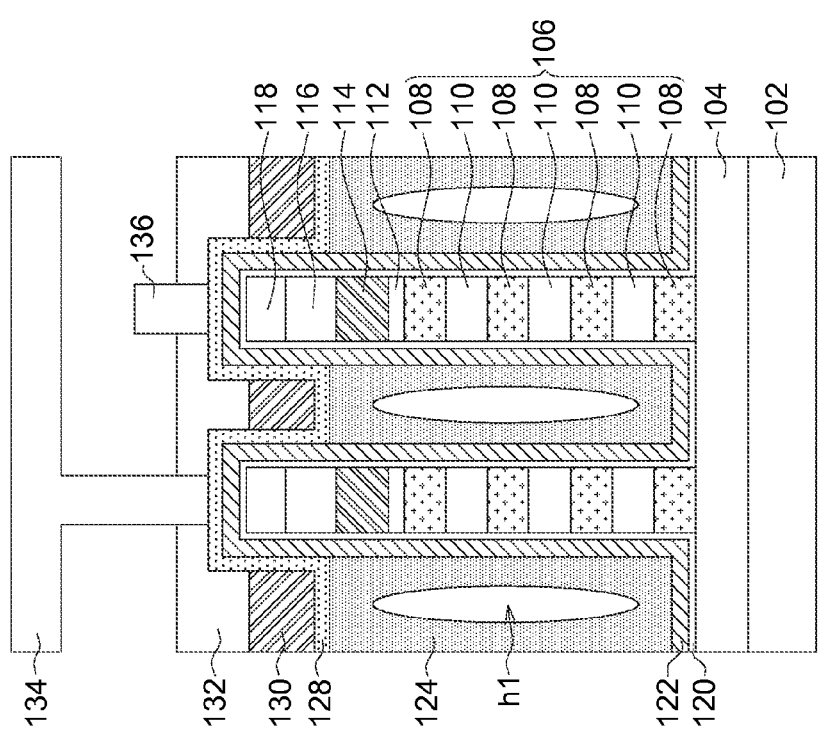

Referring to FIG. 1 and FIG. 2, a semiconductor structure according to one embodiment is illustrated. For ease of description, the semiconductor is illustrated as, but not limited to, a 3-D vertical channel NAND memory structure. The semiconductor structure comprises a substrate 102, a plurality of stacks (106-118), a blocking layer-trapping layer-tunneling layer structure 120, a plurality of channel layers 122, a first insulating material 124 and a dielectric layer 128.

The stacks are formed on the substrate 102. Each of the stacks comprises a group 106 of alternating conductive strips 108 and insulating strips 110 as well as a first string select line 114 formed on the group 106 of the conductive strips 108 and the insulating strips 110. The conductive strips 108 may be formed of poly-silicon, and the insulating strips 110 may be formed of oxide. Each of the stacks may further comprise a first insulating layer 112, a second insulating layer 116 and a third insulating layer 118. The first insulating layer 112 is formed between the first string select line 114 and the group 106 of the conductive strips 108 and the insulating strips 110. The second insulating layer 116 is formed on the first string select line 114. The third insulating layer 118 is formed on the second insulating layer 116. The first insulating layer 112 may be formed of oxide, the second insulating layer 116 may be formed of oxide, and the third insulating layer 118 may be formed of nitride, such as SiN.

The blocking layer-trapping layer-tunneling layer structure 120 is formed on the stacks. The blocking layer-trapping layer-tunneling layer structure 120 is formed conformally with the stacks. In the blocking layer-trapping layer-tunneling layer structure 120, the blocking layer is formed closest to the stack, and the tunneling layer is formed farthest away from the stacks. The blocking layer-trapping layer-tunneling layer structure 120 may be an oxide-nitride-oxide (ONO) structure, an oxide-nitride-oxide-nitride-oxide (ONONO) structure, an oxide-nitride-oxide-nitride-oxide-nitride-oxide (ONONONO) structure, or the like.

The channel layers 122 are formed on the blocking layer-trapping layer-tunneling layer structure 120. The channel layers 122 are formed conformally with the stacks. In this embodiment, the channel layers 122 on the different stacks are connected to each other. The channel layers 122 may be formed of poly-silicon.

The first insulating material 124 is formed between the stacks. The first insulating material 124 covers portions of the channel layers 122. The first insulating material 124 may be formed with holes h1 therein. The holes h1 (also known as air gap) are elongated in the height direction of the stacks. The existence of the holes h1 is beneficial for decreasing the coupling rate of two adjacent channel layers 122.

The dielectric layer 128 is formed on portions of the channel layers 122 that are not covered by the first insulating material 124. More specifically, the dielectric layer 128 may be formed conformally with the stacks and the first insulating material 124 formed between the stacks.

The semiconductor structure further comprises a plurality of second string select lines 130. The second string select lines 130 are formed between the stacks on the first insulating material 124. The second string select lines 130 are separated from the channel layers 122 by the dielectric layer 128. The dielectric layer 128 is worked as gate oxides of the second string select lines 130. The first string select lines 114 and the second string select lines 130 may be connected to metal lines, which overpass the structure, in an opposite direction for easiness of manufacture processes in the small structure.

The semiconductor structure may, as shown in FIG. 15A-FIG. 15C, further comprise a second insulating material 126 formed between the stacks. The first insulating material 124 and the second insulating material 126 are adjacent to each other at a direction in which the stacks extend. The second insulating material 126 may be formed with holes h2 therein.

The semiconductor structure may further comprise a buried layer 104 formed on the substrate 102, and the stacks are formed on the buried layer 104. The semiconductor structure may further comprise an interlayer dielectric 132 formed over the stacks and the second string select lines 130. In this embodiment, one of adjacent two of the stacks is connected to a bit line 134, and the other one of the adjacent two of the stacks is connected to a source line 136.

In this embodiment, the first string select lines 114 and the second string select lines 130 are worked together to control the current passing the channel layers 122, as shown in FIG. 2. In FIG. 2, the first string select line 114-1 and 114-2 and the second string select line 130-2 are turned on, and the second string select lines 130-1 and 130-3 are turned off. Only when both of the first string select line 114-1/114-2 and the second string select line 130-2, which are close to each other, are turned on, the current can pass through the channel layer 122 controlled by the two string select lines. In this embodiment, the current passage is U-shaped. The current may pass from the bit line 134 on one stack, through the channel layer 122 on the stack, the connecting portion of the channel layer 122 between the stacks, and the channel layer 122 on an adjacent stack, and to the source line 136 on the another stack.

FIG. 3-FIG. 15C illustrate steps of a method for manufacturing a semiconductor structure as shown in FIG. 1-FIG. 2. The figures identified by "B" and "C" are cross-sections taken along line 1-1' and line 2-2' in the figures identified "A", respectively.

Figure 3:
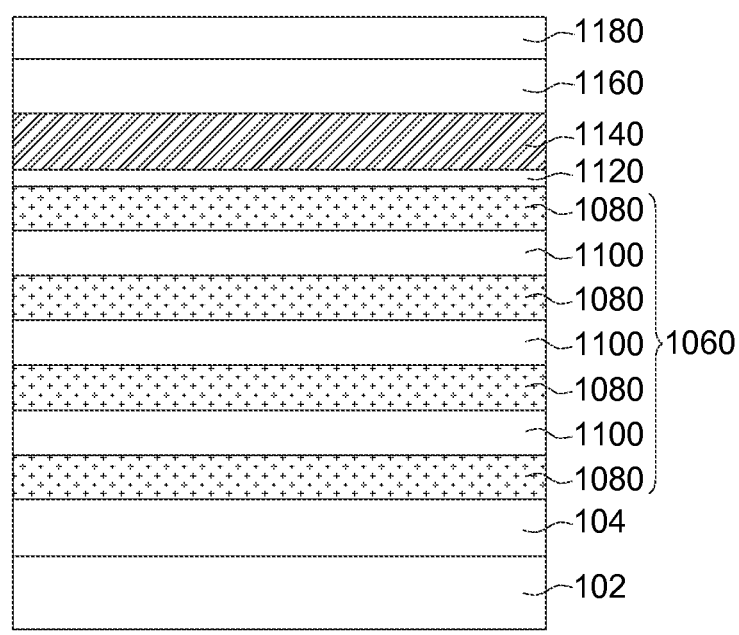

Referring to FIG. 3, a substrate 102 is provided. Optionally, a buried layer 104 is formed on the substrate 102. Then, a group 1060 of alternating conductive layers 1080 and insulating layers 1100, a first insulating layer 1120, a first string select line layer 1140 and a second insulating layer 1160 and are formed sequentially on the buried layer 104. The conductive layers 1080 may be formed of P+ poly-silicon or N+ poly-silicon, and P+ poly slilicon is preferred. The insulating layers 1100 may be formed of oxide. The first insulating layer 112 may be formed of oxide. The first string select line layer 1140 may be formed of poly-silicon. The second insulating layer 116 may be formed of oxide. Optionally, a third insulating layer 1180 is formed on the second insulating layer 1160. The third insulating layer 1180 may be formed of nitride, such as SiN. The SiN layer is a tensile layer, and the underlying oxide layers/poly-silicon layers are compressive layers. As such, the SiN layer can compensate film stress, and prevent line collapse or line bending.

Figure 4A:
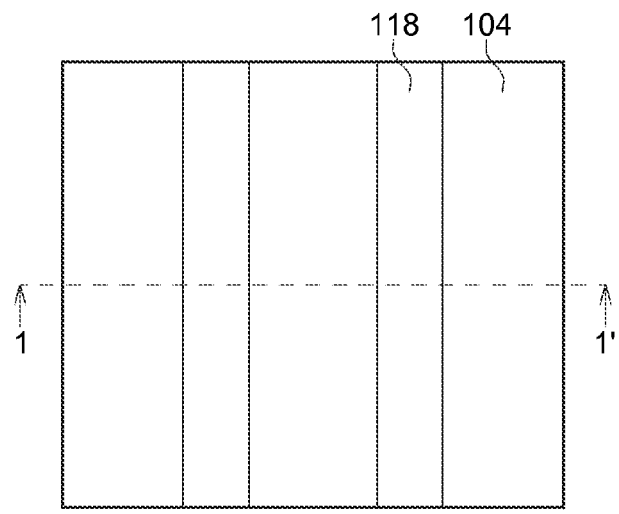
Figure 4B:
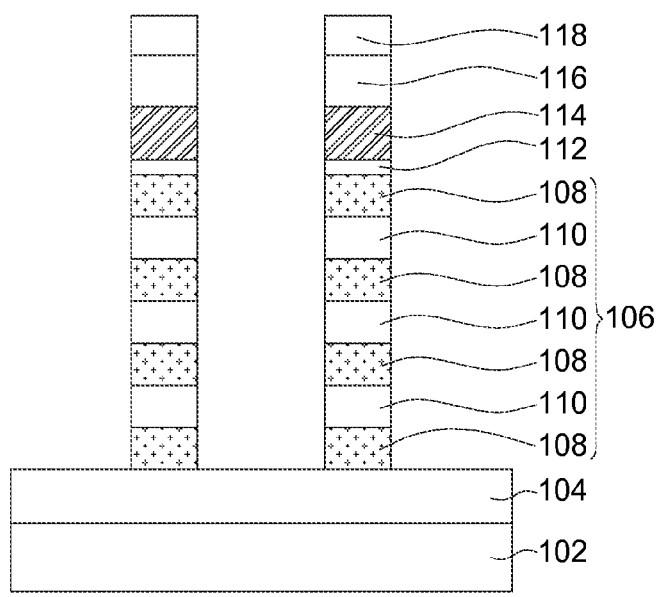

Referring to FIG. 4A-FIG. 4B, the group 1060 of the conductive layers 1080 and the insulating layers 1100, the first insulating layer 1120, the first string select line layer 1140, the second insulating layer 1160 and the third insulating layer 1180 are patterned, so as to form a plurality of stacks on the substrate 102. Each of the stacks comprises a group 106 of alternating conductive strips 108 and insulating strips 110, a first insulating layer 112 formed on the group 106 of the conductive strips 108 and the insulating strips 110, a first string select line 114 formed on the first insulating layer 112, a second insulating layer 116 formed on the first string select line 114, and a third insulating layer 118 formed on the second insulating layer 116.

Figure 5A:
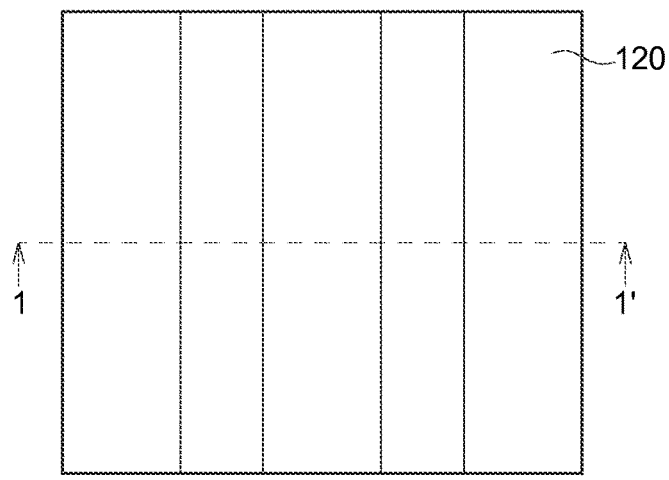
Figure 5B:
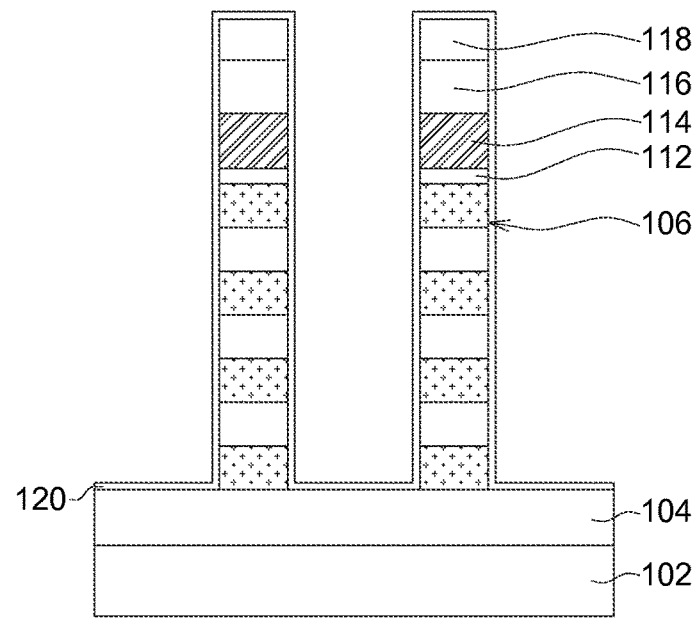

Referring to FIG. 5A-FIG. 5B, a blocking layer-trapping layer-tunneling layer structure 120 is formed on the stacks. The blocking layer-trapping layer-tunneling layer structure 120 is formed conformally with the stacks. The blocking layer is formed closest to the stack, and the tunneling layer is formed farthest away from the stacks. The blocking layer-trapping layer-tunneling layer structure 120 may be an oxide-nitride-oxide (ONO) structure, an oxide-nitride-oxide-nitride-oxide (ONONO) structure, or an oxide-nitride-oxide-nitride-oxide-nitride-oxide (ONONONO) structure. Other films served as layer-trapping layer-tunneling layer structure are also suitable for this approach.

Figure 6A:
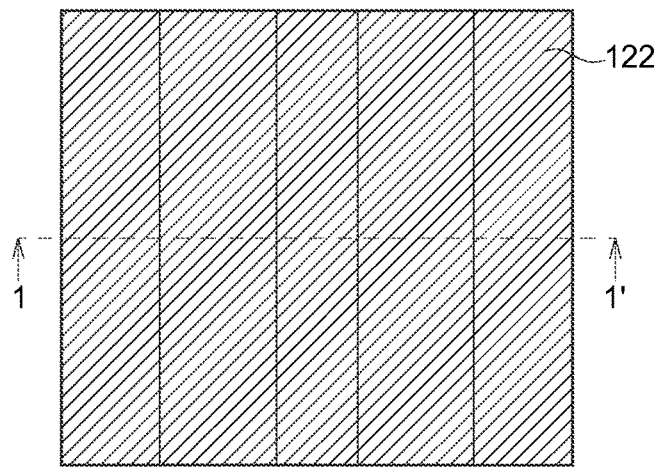
Figure 6B:
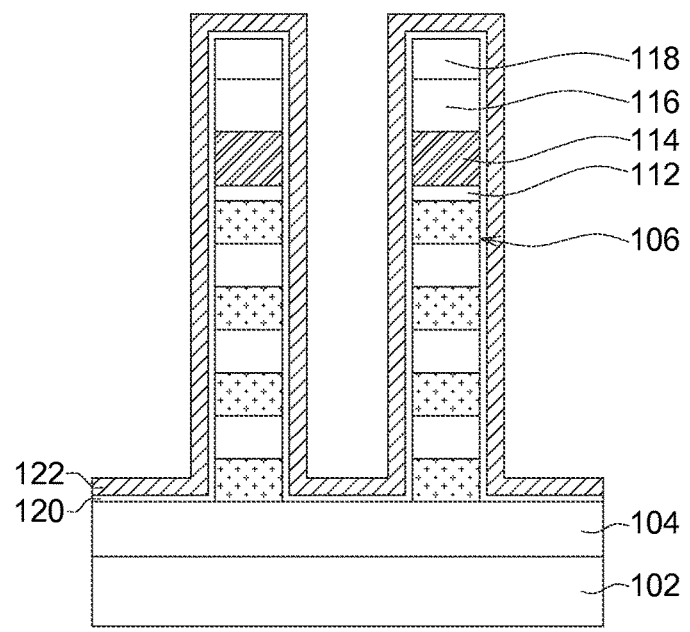

Referring to FIG. 6A-FIG. 6B, a plurality of channel layers 122 are formed on the blocking layer-trapping layer-tunneling layer structure 120. The channel layers 122 are formed conformally with the stacks. The channel layers 122 are separated from the first string select lines 114 by the blocking layer-trapping layer-tunneling layer structure 120. In this embodiment, the channel layers 122 are formed connected to each other. The channel layers 122 may be formed of undoped or intrinsic poly-silicon.

Figure 7A:
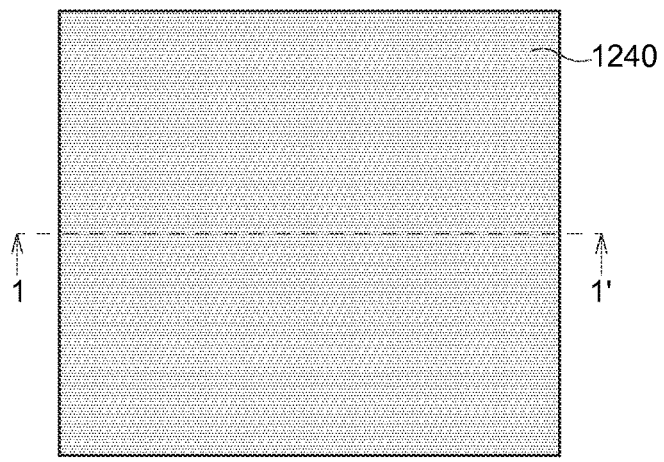
Figure 7B:
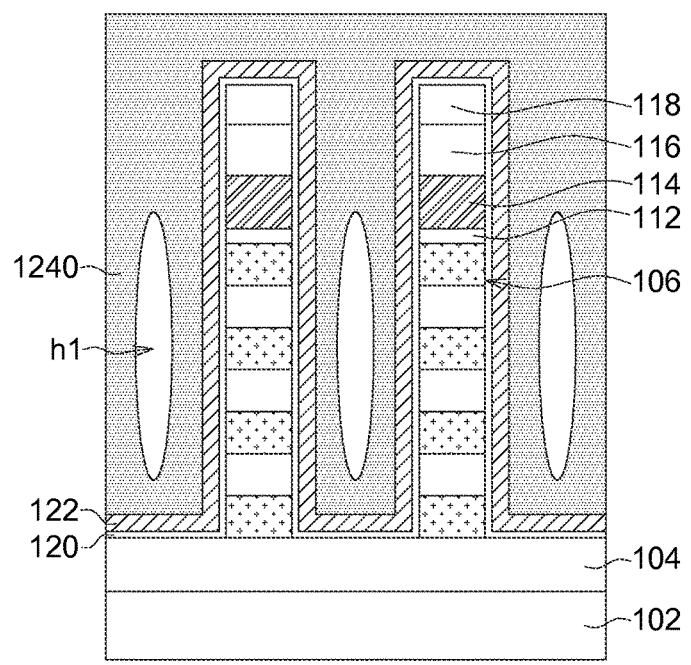

Referring to FIG. 7A-FIG. 7B, a first insulating material 1240 is formed. The first insulating material 1240 is filled into trenches between the stacks. The first insulating material 1240 may be oxide. The first insulating material 1240 may be formed with holes h1 therein. This may be achieved by using non-conformal oxide. The holes h1 are elongated in the height direction of the stacks, but the heights of the holes h1 do not extend over the second insulating layer 116. The existence of the holes h1 is beneficial for decreasing the coupling rate of two adjacent channel layers 122.

Referring to FIG. 8A-FIG. 8C, a plurality of through holes 138 are formed in the first insulating material 1240. The oval through holes 138 are formed along a direction perpendicular to the direction in which the stacks extend. The through holes 138 are surrounded by the first insulating material 1241, and penetrate through the first insulating material 1241. When forming the through holes 138, portions of the channel layers 122 are removed. As such, no channel layer 122 is existed in the through holes 138. Further, portions of the blocking layer-trapping layer-tunneling layer structure 120 may also be removed.

Referring to FIG. 9A-FIG. 9C, a second insulating material 1260 is formed. The second insulating material 1260 is filled into the through holes 138. As such, the second insulating material 1260 is formed as a sequence of oval islands arranged along the direction perpendicular to the direction in which the stacks extend. The second insulating material 1260 may be oxide. The second insulating material 1260 may be formed with holes h2 therein. This may be achieved by using non-conformal oxide. Similarly, the holes h2 are elongated in the height direction of the stacks, but the heights of the holes h2 do not extend over the second insulating layer 116. A chemical-mechanical polishing (CMP) process may be carried out if needed.

Figures 10A, 10B, 10C:
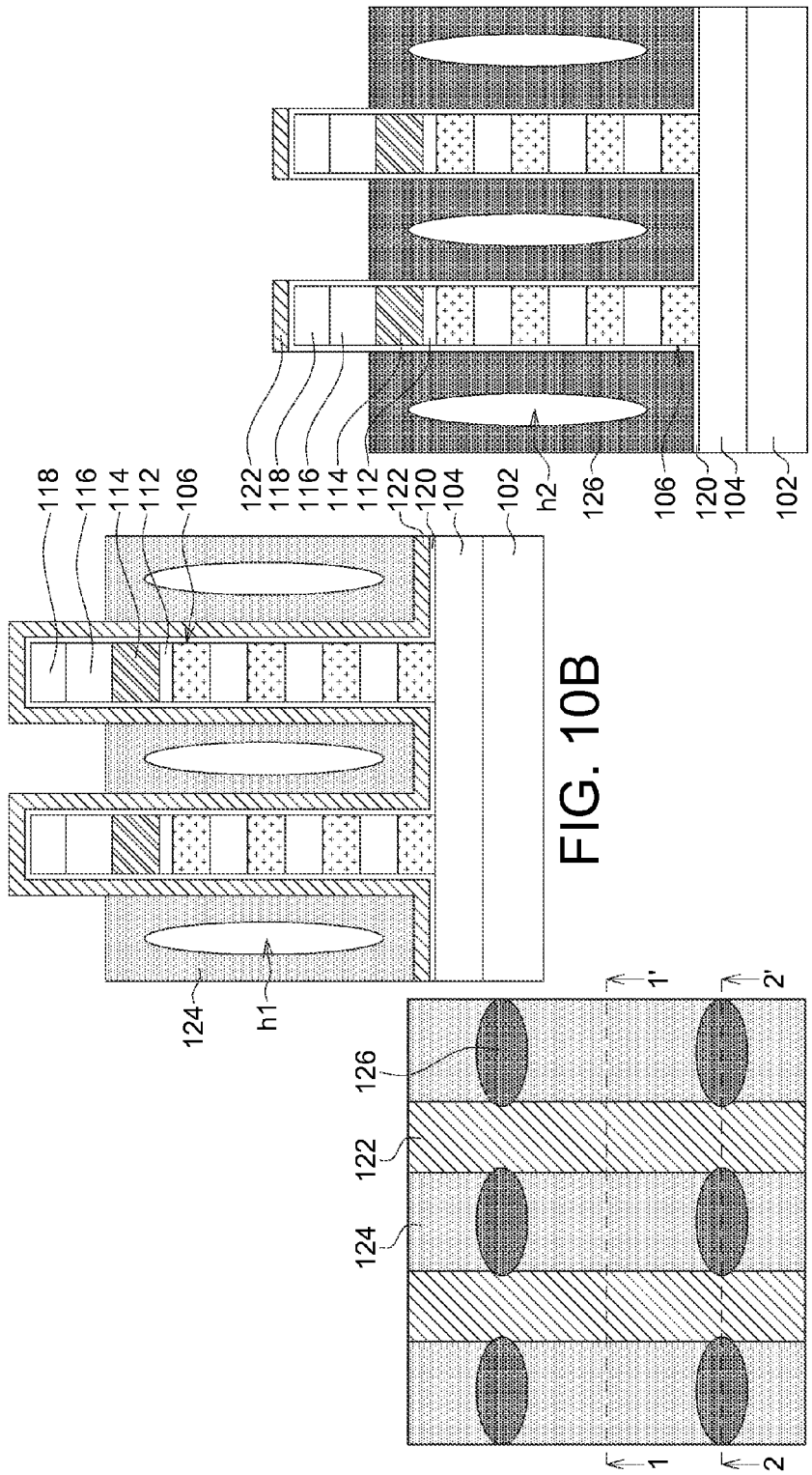

Referring to FIG. 10A-FIG. 10C, an etching-back process is carried out. The etching-back process is highly selective for poly-silicon, and will stop at poly-silicon. By this step, the first insulating material 124 remains only between the stacks, and the second insulating material 126 remains only between the stacks. The first insulating material 124 covers portions of the channel layers 122. The first insulating material 124 and the second insulating material 126 are adjacent to each other at a direction in which the stacks extend. The holes h1 and h2 do not exposed by the etching-back process. In one embodiment, dilute HF may be used to remove sidewall oxide.

Referring to FIG. 11A-FIG. 11C, a dielectric layer 128 is formed on portions of the channel layers 122 that are not covered by the first insulating material 124. The dielectric layer 128 may be formed of oxide. The dielectric layer 128 may be formed by oxidizing poly-silicon of the channel layers 122, or conformally depositing an oxide layer. If a hole h1 or h2 is exposed by the previous step, it must be sealed in this step by the conformally-deposited oxide. The dielectric layer 128 is worked as gate oxides of second string select lines 130 formed in the following step.

Referring to FIG. 12A-FIG. 12C, a plurality of second string select lines 130 are formed between the stacks on the first insulating material 124. The second string select lines 130 may be formed by deposition and etching. The second string select lines 130 are separated from the channel layers 122 by the dielectric layer 128. The second string select lines 130 and the first string select lines 114 are worked together to control the channel layers 122.

Referring to FIG. 13A-FIG. 13C, an interlayer dielectric 132 may be formed over the stacks and the second string select lines 130. The interlayer dielectric 132 may be oxide and be formed by deposition. A CMP process may be carried out if needed.

Referring to FIG. 14A-FIG. 14C, a through hole 140 is formed in the interlayer dielectric 132 on one of adjacent two of the stacks at a position corresponds to the second insulating material 126.

Referring to FIG. 15A-FIG. 15C, an insulating plug 142 is formed in the through hole 140. In other words, the insulating plug 142 is formed in the interlayer dielectric 132 on one of adjacent two of the stacks at a position corresponds to the second insulating material 126. The insulating plug 142 may be formed of oxide. Such a structure is used for isolation between two channel layers 122 on a stack. The channel layers 122 on adjacent stack is keep connected for source line.

Figure 17:
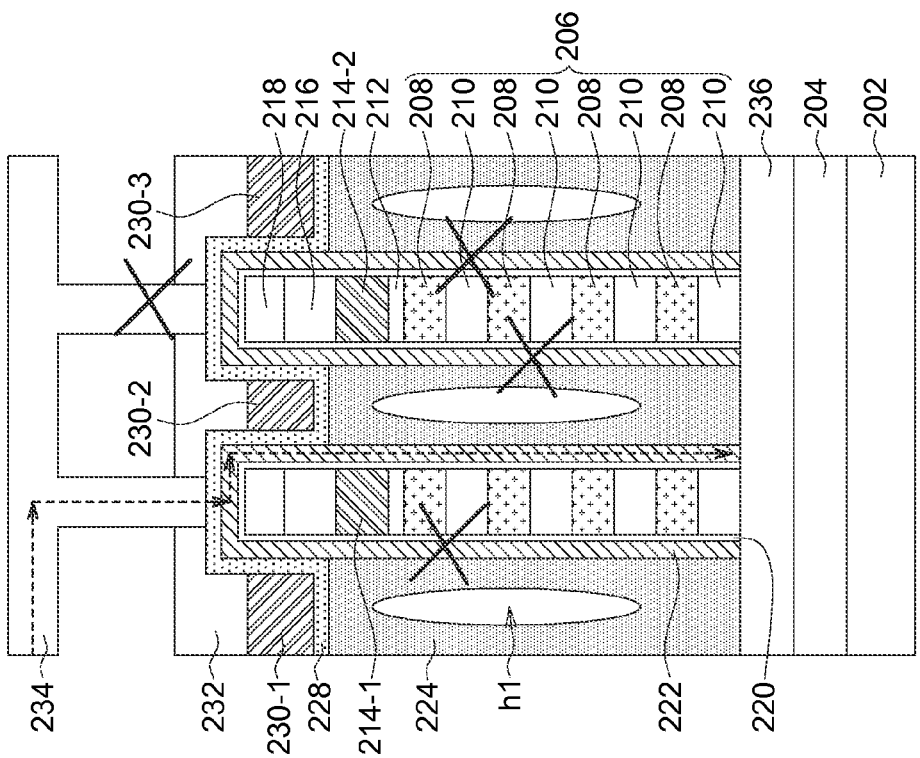
FIG. 16 and FIG. 17 illustrate a semiconductor structure according to another embodiment.
Figure 16:
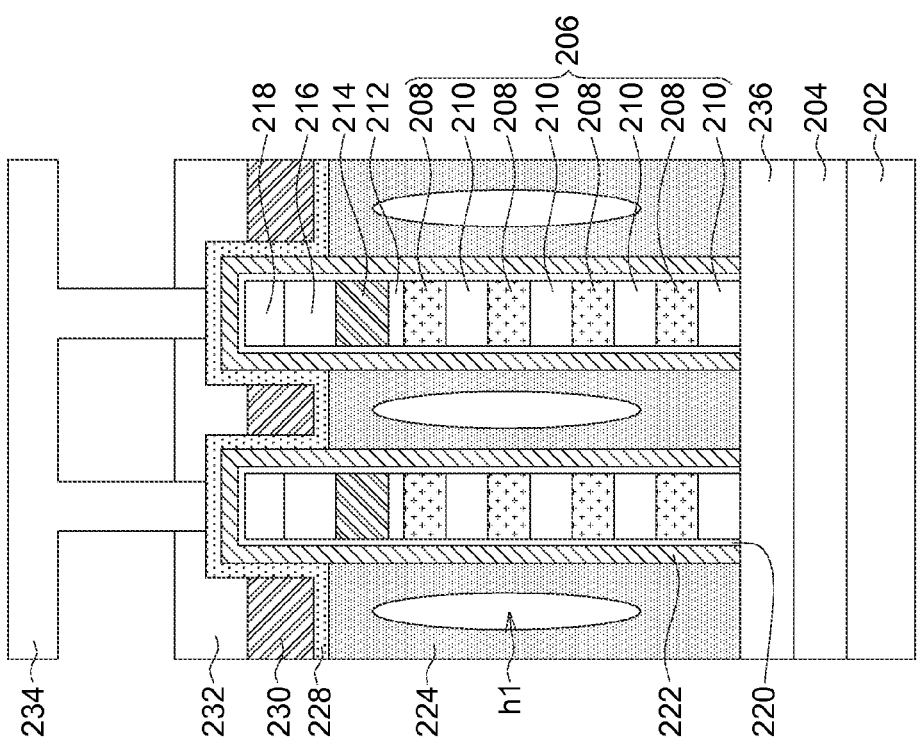

Now referring to FIG. 16 and FIG. 17, a semiconductor structure according to another embodiment is illustrated. For ease of description, the semiconductor is illustrated as, but not limited to, a 3-D vertical channel NAND memory structure. Other than those described in the follows, the forming methods, materials, and dispositions of the substrate 202, the group 206 of the conductive strips 208 and the insulating strips 210, the first insulating layer 212, the first string select line 214, the second insulating layer 216, the third insulating layer 218, the blocking layer-trapping layer-tunneling layer structure 220, the channel layers 222, the first insulating material 224, the holes h1, the second insulating material 226, the holes h2, the dielectric layer 228, the second string select lines 230, the interlayer dielectric 232, the bit line 234 and the source line 236 are similar to those of the substrate 102, the group 106 of the conductive strips 108 and the insulating strips 110, the first insulating layer 112, the first string select line 114, the second insulating layer 116, the third insulating layer 118, the blocking layer-trapping layer-tunneling layer structure 120, the channel layers 122, the first insulating material 124, the holes h1, the second insulating material 126, the holes h2, the dielectric layer 128, the second string select lines 130, the interlayer dielectric 132, the bit line 134 and the source line 136, respectively.

In this embodiment, a buried layer 204 may be formed on the substrate 202. In this embodiment, the channel layers 222 on different stacks are not connected to each other. In this embodiment, adjacent two of the stacks are connected to a bit line 234. The source line 236 may be formed under the stack, as shown in FIG. 16 and FIG. 17. Alternatively, the source line 236 may be formed in a position not directly connected with the stacks.

In this embodiment, the first string select lines 214 and the second string select lines 230 are worked together to control the current passing the channel layers 222, as shown in FIG. 17. In FIG. 17, the first string select line 214-1 and the second string select line 230-2 are turned on, and the first string select line 214-2 and the second string select lines 230-1 and 230-3 are turned off. Only when both of the first string select line 214-1 and the second string select lines 230-2, which are close to each other, are turned on, the current can pass through the channel layer 222 controlled by the two string select lines. In this embodiment, the current passage is I-shaped. The current may pass from the bit line 234 on one stack, through the channel layer 222 on the stack, and to the source line 236 under the stack.

FIG. 18A-FIG. 19C illustrate steps of a method for manufacturing a semiconductor structure as shown in FIG. 16-FIG. 17. The figures identified by "B" and "C" are cross-sections taken along line 1-1' and line 2-2' in the figures identified "A", respectively. This method is similar to the method described with respect to FIG. 3-FIG. 15C. As such, for simplicity, only some steps different from those described with respect to FIG. 3-FIG. 15C are shown.

Figure 18A:
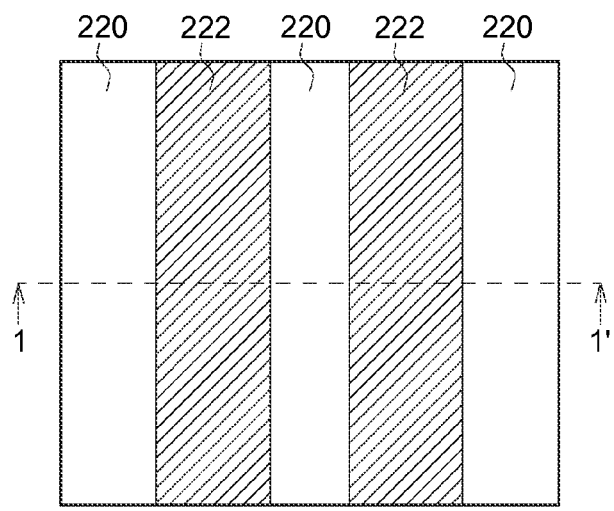
Figure 18B:
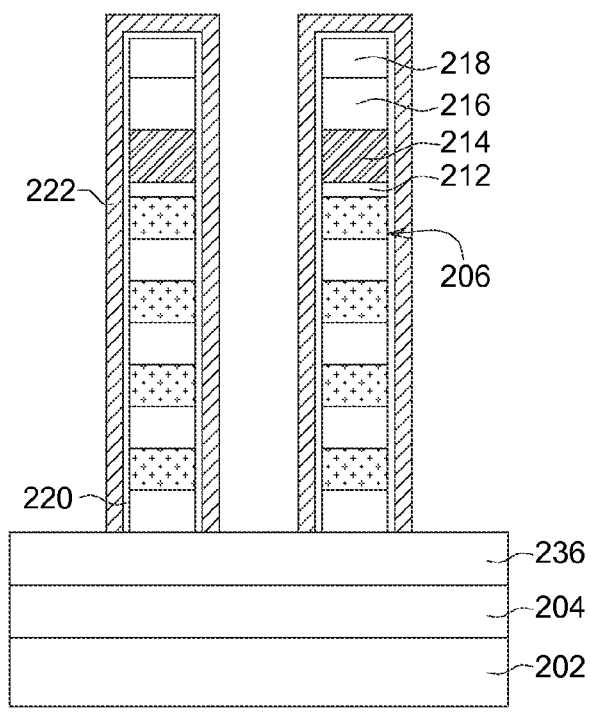

Referring to FIG. 18A-FIG. 18C, this step will instead the step illustrated in FIG. 6A-FIG. 6B. In this step, a plurality of channel layers 222 are formed on the blocking layer-trapping layer-tunneling layer structure 220. Different from the step shown in FIG. 6A-FIG. 6B, the channel layers 222 on different stacks do not connect to each other.

Referring to FIG. 19A-FIG. 19C, this step will instead the step illustrated in FIG. 15A-FIG. 15C. Different from the step shown in FIG. 15A-FIG. 15C, two insulating plugs 242 are formed in the interlayer dielectric 232 on adjacent two of the stacks at a position corresponds to the second insulating material 226.

In summary, in the semiconductor structure according to the embodiments described above, two second string lines are disposed at two sides of a channel layer by a self-aligned process. As such, the channel layer is divided into two parts respectively controlled by a first string select line and one of the two second string lines as well as the first string select line and the other one of the second string lines. Thus, physical two-bits structure can be achieved. It is noted that the first string select line and the second string line for controlling a channel layer should be disposed at different sides of the channel layer, so as to prevent bad design rules. For example, the first string select lines 114-1/214-1 is disposed at the right side, and the second string select line 130-1/230-1 is disposed at the left side.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a substrate;
   a plurality of stacks formed on the substrate, wherein each of the stacks comprises:
   a group of alternating conductive strips and insulating strips;
   a first string select line formed on the group of the conductive strips and the insulating strips;
   a first insulating layer formed between the first string select line and the group of the conductive strips and the insulating strips;
   a second insulating layer formed on the first string select line; and
   a third insulating layer formed on the second insulating layer;
   a blocking layer-trapping layer-tunneling layer structure formed on the stacks, the blocking layer-trapping layer-tunneling layer structure being formed conformally with the stacks;
   a plurality of channel layers formed on the blocking layer-trapping layer-tunneling layer structure, the channel layers being formed conformally with the stacks;
   a first insulating material formed between the stacks, the first insulating material covering portions of the channel layers;
   a dielectric layer formed on portions of the channel layers that are not covered by the first insulating material; and
   a plurality of second string select lines formed between the stacks on the first insulating material, wherein the second string select lines are separated from the channel layers by the dielectric layer.

2. The semiconductor structure according to claim 1, wherein the first insulating material is formed with holes therein.

3. The semiconductor structure according to claim 1, further comprising:
   a second insulating material formed between the stacks, wherein the first insulating material and the second insulating material are adjacent to each other at a direction in which the stacks extend.

4. The semiconductor structure according to claim 3, wherein the second insulating material is formed with holes therein.

5. The semiconductor structure according to claim 1, further comprising:
   an interlayer dielectric formed over the stacks and the second string select lines.

6. The semiconductor structure according to claim 1, wherein the channel layers are connected to each other, and the semiconductor structure further comprises:
   a buried layer formed on the substrate, wherein the stacks are formed on the buried layer.

7. The semiconductor structure according to claim 1, wherein one of adjacent two of the stacks is connected to a bit line, and the other one of the adjacent two of the stacks is connected to a source line.

8. The semiconductor structure according to claim 1, further comprising:
   a source line formed on the substrate.

9. The semiconductor structure according to claim 8, wherein adjacent two of the stacks are connected to a bit line.

10. A method for manufacturing a semiconductor structure, comprising:
    providing a substrate;
    forming a plurality of stacks on the substrate, wherein each of the stacks comprises:
    a group of alternating conductive strips and insulating strips; and
    a first string select line formed on the group of the conductive strips and the insulating strips;
    forming a blocking layer-trapping layer-tunneling layer structure on the stacks, the blocking layer-trapping layer-tunneling layer structure being formed conformally with the stacks;
    forming a plurality of channel layers on the blocking layer-trapping layer-tunneling layer structure, the channel layers being formed conformally with the stacks;
    forming a first insulating material between the stacks, the first insulating material covering portions of the channel layers;
    forming a second insulating material between the stacks, wherein the first insulating material and the second insulating material are adjacent to each other at a direction in which the stacks extend;
    forming a dielectric layer on portions of the channel layers that are not covered by the first insulating material; and
    forming a plurality of second string select lines between the stacks on the first insulating material, wherein the second string select lines are separated from the channel layers by the dielectric layer.

11. The method according to claim 10, wherein each of the stacks further comprises:
    a first insulating layer formed between the first string select line and the group of the conductive strips and the insulating strips;
    a second insulating layer formed on the first string select line; and
    a third insulating layer formed on the second insulating layer.

12. The method according to claim 10, wherein the first insulating material is formed with holes therein.

13. The method according to claim 10, wherein the second insulating material is formed with holes therein.

14. The method according to claim 10, wherein the second insulating material is formed as a sequence of oval islands arranged along a direction perpendicular to the direction in which the stacks extend.

15. The method according to claim 10, further comprising:
    forming a buried layer on the substrate, wherein the stacks are formed on the buried layer; and wherein the channel layers are formed connected to each other.

16. The method according to claim 15, further comprising:
- forming an interlayer dielectric over the stacks and the second string select lines; and
- forming an insulating plug in the interlayer dielectric on one of adjacent two of the stacks at a position corresponds to the second insulating material.

17. The method according to claim 10, further comprising:
- forming a source line on the substrate.

18. The method according to claim 17, further comprising:
- forming an interlayer dielectric over the stacks and the second string select lines; and
- forming two insulating plugs in the interlayer dielectric on adjacent two of the stacks at a position corresponds to the second insulating material.

* * * * *